United States Patent [19]
Kobayashi et al.

[11] Patent Number: 5,005,075
[45] Date of Patent: Apr. 2, 1991

[54] X-RAY MASK AND METHOD OF MANUFACTURING AN X-RAY MASK

[75] Inventors: Masato Kobayashi, Miyagi; Yoh-Ichi Yamaguchi, Tokyo; Minoru Sugawara, Tokyo; Kazuhide Yamashiro, Tokyo, all of Japan

[73] Assignee: Hoya Corporation, Tokyo, Japan

[21] Appl. No.: 487,771

[22] Filed: Jan. 30, 1990

[30] Foreign Application Priority Data

Jan. 31, 1989 [JP] Japan .................................. 1-22198
Oct. 27, 1989 [JP] Japan .................................. 1-281132

[51] Int. Cl.$^5$ .................... G21K 5/00; H01L 21/306; B44C 1/22; C23F 1/00
[52] U.S. Cl. ...................... 378/35; 156/626; 156/643; 156/644; 156/646; 156/653; 156/656; 156/657; 156/659.1; 156/662; 204/192.37; 430/5
[58] Field of Search ............... 156/626, 643, 644, 646, 156/647, 653, 656, 657, 659.1, 662, 664, 668; 204/192.32, 192.35, 192.37; 252/79.1; 430/5; 378/35; 428/138, 209

[56] References Cited

U.S. PATENT DOCUMENTS

| 4,384,919 | 5/1983 | Casey | 156/645 |
| 4,543,266 | 9/1985 | Matsuo et al. | 427/38 |
| 4,701,391 | 10/1987 | Lentfer et al. | 430/5 |

OTHER PUBLICATIONS

SPIE vol. 773 Electron-Beam, X-Ray and Ion-Beam Lithographies VI (1987).
SPIE vol. 923 Electron-Beam, X-Ray and Ion-Beam Technology Submicrometer Lithographies VII (1988).

*Primary Examiner*—William A. Powell
*Attorney, Agent, or Firm*—Ladas & Parry

[57] ABSTRACT

In a method of manufacturing an X-ray mask comprising a substrate, an X-ray transmission layer on the substrate, an X-ray absorption layer on the X-ray transmission layer, the X-ray transmission layer is flattened to remove undulation and to make roughness of the X-ray transmission layer smaller than 100 angstroms. The X-ray transmission layer may be formed by silicon carbide or silicon nitride. Alternatively, the X-ray transmission layer may have a multilayer structure of sandwiched structure comprising either a silicon carbide film or a silicon nitride film.

11 Claims, 3 Drawing Sheets

X-RAY MASK AND METHOD OF MANUFACTURING AN X-RAY MASK

BACKGROUND OF THE INVENTION

This invention relates to a method of manufacturing an X-ray mask used in X-ray lithography.

Recently, remarkable integration has been accomplished in a very large scale integration circuit or the like, with development of a semiconductor technique. Under the circumstances, it is a recent trend that X-ray lithography is used instead of conventional photolithography so as to transfer a fine pattern with a high precision onto a semiconductor wafer. With this X-ray lithography, exposure is made in the X-ray lithography by the use of an X-ray which has a wavelength shorter than light, such as ultraviolet rays or the like. Therefore, the X-ray lithography makes it possible to delineate a fine pattern, as compared with the photolithography.

In such X-ray lithography, an X-ray mask is inevitably used to delineate such a fine pattern. The X-ray mask usually comprises a substrate, an X-ray transmission layer on the substrate, and an X-ray absorption layer on the X-ray transmission layer.

The X-ray transmission layer may be formed either by a single film or by a plurality of films and should have the following properties in addition to high transmittivity against the X-ray. Namely, the X-ray transmission layer must have:

(1) a weak tensile stress as an internal stress;
(2) a characteristic strongly withstanding X-ray radiation carried out on exposure and consequently an invariable characteristic against the X-ray radiation;
(3) a desired flatness or roughness;
(4) excellent chemical stability;
(5) high transmittivity against visible light; and
(6) excellent mechanical strength.

In addition, the X-ray absorption layer must also satisfy various kinds of requirements which are similar to those exemplified above in connection with the X-ray transmission layer. Moreover, the X-ray absorption layer must have a layer structure which is suitable for delineating a fine pattern and which can therefore be readily etched. Therefore, it is preferable that the X-ray absorption layer has an amorphous or a fine crystal structure.

A wide variety of attempts have been made in order to obtain the above-mentioned properties. For example, various kinds of materials, such as silicon carbide (SiCx), silicon nitride (SiNx), boron nitride (BN), or silicon, have been used as materials of the X-ray transmission layer. In addition, deposition methods have been proposed to deposit the X-ray transmission layer and may be, for instance, decompressed chemical vapor deposition, plasma chemical vapor deposition, or sputtering. Such deposition methods may be carried out within various atmospheres.

However, it has been very difficult to deposit a desired X-ray transmission layer which satisfies all of the above-mentioned properties. This is because improvement of either one of the properties often brings about a difficulty of improving the other properties. For example, the internal stress preferably falls within a very narrow preferable range between $2 \times 10^8$ dyn/cm$^2$ and $8 \times 10^8$ dyn/cm$^2$. In order to adjust the internal stress to the above range, restriction should be strictly imposed on deposition of the X-ray transmission layer. However, such restriction makes it difficult to select conditions for the other properties.

Herein, a conventional thought is rarely directed to the flatness or roughness of the X-ray transmission layer. According to the conventional thought, it has been imagined that the flatness of the X-ray transmission layer has not been significant so much to determine a whole characteristic of the X-ray mask. In this situation, it has been considered that the X-ray transmission layer may have the flatness of 500–1000 angstroms or so.

In other words, consideration has not been made at all about improvement of the flatness in the X-ray transmission layer.

According to the inventor's experimental studies, it has been found out that an excellent X-ray absorption layer can not be obtained when the X-ray transmission layer has the flatness between 500–1000 angstroms or so. Especially, the flatness and the internal stress of the X-ray absorption layer are deteriorated in dependency upon the flatness of the X-ray transmission layer.

In addition, the internal stress of the X-ray transmission layer can not be controlled within the preferable range even when the flatness of the X-ray transmission layer is adjusted to the extent of 500–1000 angstroms or so. As a result, degradation of the flatness of the X-ray transmission layer brings about deterioration of the flatness and the internal stress of the X-ray absorption layer.

SUMMARY OF THE INVENTION

It is an object of this invention to provide a method of manufacturing an X-ray mask which has an improved characteristic.

It is another object of this invention to provide a method of the type described, which is capable of adjusting a flatness of an X-ray transmission layer to preferable ranges without deterioration of a whole characteristic of the X-ray mask.

A method to which this invention is applicable is for manufacturing an X-ray mask which is for use in an X-ray lithograpy and which comprises a substrate having a principal surface, an X-ray transmission layer on the principal surface, and an X-ray absorption layer on the X-ray transmission layer. According to this invention, the method comprises the steps of determining conditions of depositing the X-ray transmission layer on the principal surface under the conditions. The X-ray transmission layer has undulation. The method further comprises the steps of flattening the undulation of the X-ray transmission layer and depositing the X-ray absorption layer.

A flatness of the flattened X-ray transmission layer may be evaluated by an average roughness. The average roughness may be preferably not greater than 100 angstroms. It has been confirmed that, when the average roughness is not greater than 100 angstroms, it is possible to improve the flatness of the X-ray absorption layer and to reduce the internal stress of the X-ray absorption layer to a preferable range.

DESCRIPTION OF THE PREFERRED EMBODIMENTS

First Embodiment

Referring to FIGS. 1(A) through 1(G), a method according to a first embodiment of this invention is for use in manufacturing an X-ray mask which has X-ray transmission layers each of which is composed of a single film, as will become clear as the description proceeds. In the example being illustrated, a substrate 11 of silicon is prepared which has a crystal orientation of (100) and front and rear surfaces directed upwards and downwards of FIG. 1, respectively.

Figure 1A:
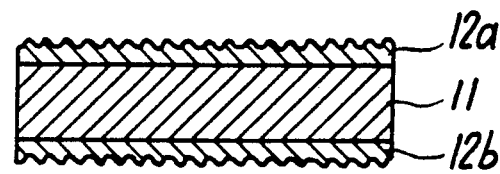
FIGS. 1(A) through (G) are sectional views for use in describing methods according to first and second embodiments of this invention.

As shown in FIG. 1(A), X-ray transmission layers 12a and 12b of silicon carbide (SiCx) are deposited by decompressed chemical vapor deposition on both the front and the rear surfaces of the substrate 11, respectively, and will be called first and second transmission layers 12a and 12b, respectively. Such deposition of the first and the second transmission layers 12a and 12b is made within a reactive chamber (not shown) into which a plurality of gases can be introduced from a plurality of gas reservoirs or bombs through gas conduits. Specifically, dichlorosilane and acetylene are introduced as reactive gases into the chamber by using hydrogen as a carrier gas, on deposition of the illustrated transmission layers 12a and 12b of silicon carbide. Each of the first and the second transmission layers 12a and 12b is deposited to a thickness of 2 micron meters. For this purpose, the dichlorosilane, the acetylene, and the hydrogen are introduced into the reactive chamber through different ones of the gas conduits at flow rates of 200 cc/minute, 30 cc/minute, and 2000 cc/minute, respectively, in a normal state.

Within the reactive chamber, the reactive gas is kept at a deposition pressure of 10 Torr and a deposition temperature is held at 1000° C. and may be called a chamber heating temperature. The above-mentioned deposition conditions are selected in consideration of the internal stress, the visible light transmittivity, and the chemical stability.

As a result, the first and the second transmission layers 12a and 12b thus deposited has the tensile stress of $10 \times 10^8$ dyn/cm$^2$, the transmittivity of 40% against visible light having a wavelength of 633 nm, and an excellent chemical stability. The chemical stability is evaluated by alkali-resistance of each of the first and the second transmission layers 12a and 12b. Actually, each of the first and the second transmission layers 12a and 12b is not eroded at all by solution which includes 50 wt % of sodium hydroxide (NaOH) and which is heated to 100° C.

Thereafter, surfaces of the first and the second transmission layers 12a and 12b are observed by the use of a scanning electron microscope. As a result of observation, it has been found out that the surfaces of the first and the second transmission layers 12a and 12b are undesirably undulated with projections scattered thereon and that undulation on the surfaces becomes worse in dependency upon contamination of a decompressed chemical vapor deposition device and the gas conduits, degradation of the reactive gas, and a variation of the above-mentioned deposition conditions.

Figure 1B:
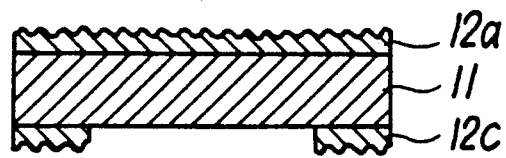

In FIG. 1(B), the second transmission layer 12b which is deposited on the rear surface of the substrate 11 is partially etched by reactive ion etching. On etching the second transmission layer 12b, a center portion of the second transmission layer 12b is circularly etched with a periphery of the second transmission layer 12b left as a ring shaped layer 12c, as illustrated in FIG. 1(B). During the reactive ion etching, a mixed gas of a fluorine gas and an oxygen gas is used as an etching gas. The fluorine gas may be, for example, CF$_4$ gas. The reactive ion etching is carried out on conditions that flow rates of CF$_4$ gas and the oxygen gas are kept at 30 cc/minute and 10 cc/minute, respectively, in a normal state with a gas pressure held at 4 Pa and with radio frequency (RF) power set at 0.49 W/cm$^2$. At any rate, the second transmission layer 12b is etched at an etching rate of 420 angstroms.

Figure 1C:
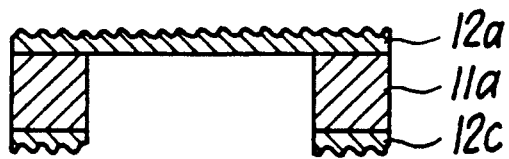

Subsequently, the substrate 11 illustrated in FIG. 1(B) is subjected to wet etching within solution which includes 10 to 50 wt% of sodium hydroxide (NaOH) and which is heated to a temperature between 80° C. and 100° C. As a result, a center zone of the substrate 11 is etched to the first transmission layer 12a through the ring shaped layer 12c which serves as a mask, as illustrated in FIG. 1(C). Thus, a peripheral portion 11a of the substrate alone is left between the first transmission layer 12a and the ring shaped layer 12c, as shown in FIG. 1(C).

Figure 1D:
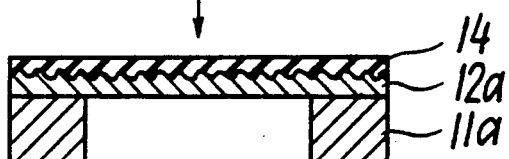

Thereafter, the first transmission layer 12a is subjected to flattening process, as illustrated in FIGS. 1(D) and (E). To this end, a known etch back method is used to carry out the flattening process in the example being illustrated. More particularly, a dummy layer 14 is coated on the first transmission layer 12a, for example, by spin coating, as shown in FIG. 1(D). The dummy layer 14 is flattened in a known manner and may be formed by a resist layer known in the art. In the illustrated example, the dummy layer 14 is coated by the use of a coating solution which includes SiO$_2$ and which is manufactured and sold in the name of OCD by Tokyo Ohka Kogyo Co., Ltd., Kawasaki, Japan. After spin coating of the dummy layer 14, the dummy layer 14 is fired together with the first transmission layer 12a for three minutes in a nitrogen atmosphere kept at 150° C. and is thereafter fired at a temperature of 350° C. for one hour. It is possible to flatten a surface of the dummy layer 14 simultaneously with coating. The illustrated dummy layer 14 is about 4500 angstroms thick.

The dummy layer 14 may be, for example, an inorganic layer or an organic layer which is coated by sputtering, chemical vapor deposition, or spin coating. It is to be noted that the dummy layer 14 is preferably formed by a material etched at the same etching rate as the first transmission layer 12a.

Figure 1E:
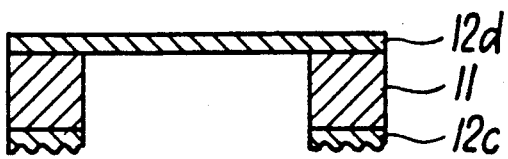

After coating, the dummy layer 14 is etched from its surface by plasma etching, reactive ion etching, reactive ion beam etching, or the like, as illustrated in FIG. 1(E). Such etching proceeds from the surface of the dummy layer 14 towards the first transmission layer 12a. Now, it is assumed that the reactive ion etching is used to etch the dummy layer 14 and the first transmission layer 12a. In this event, such reactive ion etching can be made by the use of a mixed gas composed of a gas of carbon tetrachloride and an oxygen gas. The reactive ion etching is carried out in a normal state on the following conditions:

flow rate of the carbon tetrachloride gas: 26 cc/minute,
flow rate of the oxygen gas: 4 cc/minute,
gas pressure during the etching: 3 Pa,
radio frequency (RF) power: 0.32 W/cm$^2$, and
etching rate: 490 angstroms/minute.

The above-mentioned etching is uniformly carried out over a whole surface of the dummy layer 14 and the first transmission layer 12a. As a result, the dummy layer 14 is completely removed on the whole together with the first transmission layer 12a. Thus, the first transmission layer 12a is flattened into a uniform transmission layer 12d, as illustrated in FIG. 1(E).

Under the circumstances, the surface of the uniform transmission layer 12d is observed by the use of the scanning electron microscope. In consequence, it has been found out that the projections or undulations are completely removed from the surface of the uniform transmission layer 12d and that the uniform transmission layer 12d has excellent flatness all over the surface thereof.

In order to investigate such flatness, surface roughness is measured before and after the etching by the use of a tracer method. In this event, the surface roughness becomes equal to 500 angstroms before the etching while it becomes equal to 50 angstroms after the etch back. Such surface roughness is represented by average roughness of ten points in the example being illustrated.

Figure 1F:
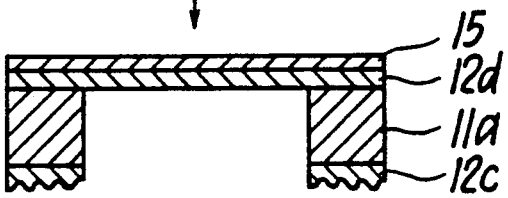

In FIG. 1(F), an X-ray absorption layer 15 is deposited to a thickness of 0.6 micron meter by the use of radio frequency magnetron sputtering on the uniform transmission layer 12d flattened by the etch back method. The illustrated X-ray absorption layer 15 is composed of tantalum and boron. The above-mentioned magnetron sputtering is carried out by the use of a sputter target including tantalum and boron in a sputter gas composed of argon gas.

In this case, it has been found out that similar results are accomplished even when a composition ratio between tantalum and boron is varied. Therefore, consideration will be made only about the sputter target which has the composition ratio between tantalum and boron that is equal to 4:1. The X-ray absorption layer 15 which is deposited on the uniform transmission layer 12d by the use of the above-mentioned sputter target may be called boric tantalum layer. The X-ray absorption layer 15 of boric tantalum is deposited in an argon gas atmosphere with the flow rate of argon kept at 51 cc/minute in a normal state and with the gas pressure and the radio frequency power held at 1.9 Pa and 8.64 W/cm$^2$, respectively.

According to the inventors' experimental studies, it has been confirmed that the X-ray absorption layer 15 has an amorphous structure and the internal stress between 0 and $1 \times 10^8$ dyn/cm$^2$. From this fact, it can be concluded that the X-ray absorption layer 15 has a preferable amorphous structure and an excellent internal stress when it is deposited on a uniform and flattened X-ray transmission layer. In addition, it has been found out that the X-ray absorption layer 15 exhibits an excellent flatness like the uniform transmission layer 12d.

Figure 1G:
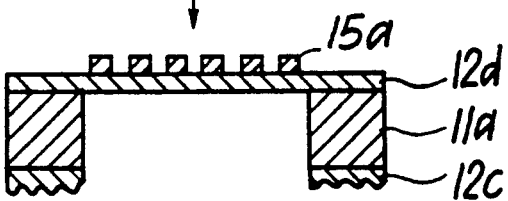

In FIG. 1(G), the X-ray absorption layer 15 processed in the above-mentioned manner is subjected to reactive ion beam etching to leave patterns 15a of the X-ray absorption layer 15 on the uniform transmission layer 12d. Such reactive ion beam etching is carried out in a chlorine gas atmosphere by using a resist pattern as a mask. Thus, an X-ray mask is manufactured, as illustrated in FIG. 1(G).

In fact, it has been possible for the illustrated X-ray mask to delineate a fine pattern equal to or smaller than 0.25 micron meter.

According to the above-mentioned method, the X-ray transmission layer 12a may be deposited on the substrate 11 without considering flatness of the X-ray transmission layer, because the X-ray transmission layer 12a is flattened after deposition. In other words, the internal stress alone may be considered on depositing the X-ray transmission layer 12a. This means that restriction can be remarkably alleviated on depositing the X-ray transmission layer and that the X-ray transmission layer may be deposited under a wide variety of conditions.

Moreover, the X-ray transmission layer 12a can be readily flattened or smoothed by the use of an etch back method. In addition, an optimum or uniform X-ray transmission layer can be readily formed because the internal stress and the flatness or roughness of the surface of the X-ray transmission layer 12a can be readily adjusted to pertinent values. Deposition of such a uniform transmission layer serves to insure characteristics of the X-ray absorption layer 15 and brings about improvement of quality in the X-ray mask and improvement of productivity.

Herein, let the flattening process illustrated in FIGS. 1(D) and (E) be removed like in a conventional method. In this event, an X-ray transmission layer is deposited as an unprocessed transmission layer on the same conditions as the X-ray transmission layer 12a illustrated in FIG. 1(A) and has the surface roughness of 500 angstroms. When an X-ray absorption layer is deposited on such an unprocessed transmission layer, it has been confirmed that the deposited X-ray absorption layer is formed by a polycrystal of columnar structure and has an undesirably large internal stress of, for example, $10 \times 10^8$ dyn/cm$^2$. In the illustrated example, any other flattening methods may be substituted for the etch back method. The etching process illustrated in FIGS. 1(B) and (C) may be carried out after the flattening process illustrated in FIG. 1(F).

Second Embodiment

Referring to FIGS. 1(A) through (G) again, description will be made as regards a method according to a second embodiment of this invention, because the method according to the second embodiment is similar to that of the first embodiment except that the X-ray transmission layers 12a and 12b are formed by silicon nitride (SiNx) instead of silicon carbide (SiCx). In FIG. 1(A), the X-ray transmission layers 12a and 12b of silicon nitride may be called first and second transmission layers, respectively, and are deposited to a thickness of 2 micron meters by the use of a reactive gas composed of dichlorosilane and ammonia (NH$_3$). In this event, dichlorosilane and ammonia are introduced at flow rates of 160 cc/minute and 40 cc/minute, respectively, into the reactive chamber through different conduits. The resultant reactive chamber is heated to a temperature of 880° C. and is kept at a gas pressure of 0.17 Torr. The deposited X-ray transmission layers 12a and 12b have an internal stress of $6 \times 10^8$ dyn/cm$^2$, a visible light transmittivity between 70% and 90%, a hydrostatic pressure of 0.50 kg/cm$^2$, and an excellent alkali-resistance against solution of 50% sodium hydroxide heated to 100° C. As specified by the excellent alkali-resistance, the X-ray transmission layers 12a and 12b have an excellent chemical stability. From this fact, it is readily understood that the X-ray transmission layers 12a and 12b have excellent properties except the flatness or roughness of the surface of the X-ray transmission layers 12a and 12b.

As shown in FIG. 1(B), the second transmission layer 12b is selectively etched with the peripheral portion 12c of the second transmission layer 12b remaining on the substrate 11. The second transmission layer 12b is etched by an etching gas which includes fluorine gas, such as $CF_4$ gas, on conditions that the etching gas is caused to flow at the flow rate of 80 cc/minute and is kept at a gas pressure of 4 Pa during the etching. In addition, the etching is carried out by impressing the radio frequency power of 0.49 W/cm$^2$. Under the circumstances, the second transmission layer 12b is etched at an etching rate of 640 angstroms/minute. Thereafter, the substrate 11 is etched by wet etching in the manner described in conjunction with the second transmission layer 12b of silicon carbide, as illustrated in FIG. 1(C).

In order to flatten the first transmission layer 12a, a resist layer 14 which includes silicon is coated as a dummy layer on the first transmission layer 12a and is 3000 angstroms thick like in the first embodiment, as illustrated in FIG. 1(D). After the resist layer 14 is completely coated on the first transmission layer 12a, reactive ion etching is carried out by the use of an etching gas which includes fluorine gas, such as $CF_4$ gas, to etch the resist layer 14 and a part of the first transmission layer 12a on conditions that the $CF_4$ gas is caused to flow at the flow rate of 40 cc/minute in a normal state and is kept at a gas pressure of 2 Pa while the radio frequency power is set to 0.65 W/cm$^2$. In this event, both the dummy layer 14 and the first transmission layer 12a are etched at the etching rate of 400 angstroms/minute. Consequently, a uniform transmission layer 12d is left on the substrate 11.

The surface roughness is monitored by the tracer method so as to determine the flatness of the first transmission layer 12a before and after the reactive ion etching of the resist layer 14. The surface roughness of the first transmission layer 12a is equal to 1000 angstroms before the reactive ion etching while the surface roughness is reduced to 50 angstroms in the uniform transmission layer 12d after the reactive ion etching. Such surface roughness has been represented by average roughness of ten points determined by JIS B 0601.

Subsequently, the X-ray absorption layer 15 is deposited in the manner illustrated in conjunction with the first embodiment and etched by reactive ion beam etching to leave patterns on the uniform transmission layer 12d, as shown in FIGS. 1(F) and (G).

With this embodiment, it is possible to obtain an X-ray mask which comprises an X-ray transmission layer and an X-ray absorption layer each of which has desired internal stress and flatness.

Third Embodiment

Referring to FIGS. 2(A) through (I), a method according to a third embodiment of this invention is for used in manufacturing an X-ray mask which comprises a plurality of X-ray transmission films, as will become clear and which may be referred to as a multilayer type mask. Such a multilayer type mask is specified by a multilayer structure of the X-ray transmission films. Although proposal has been made as regards the multilayer structure, such as a combination of silicon nitride - silicon carbide - silicon nitride, a combination of silicon oxide - silicon carbide - silicon oxide, or the like, the following description is directed to a multilayer structure of X-ray transmission layers which is specified by a combination of silicon oxide - silicon carbide - silicon oxide.

Figure 2A:
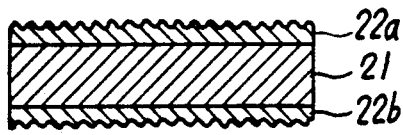
FIGS. 2(A) through (I) are sectional views for use in describing a method according to a third embodiment of this invention.

At first, a silicon substrate 21 of crystal orientation (100) is prepared to form the X-ray mask having the multilayer structure mentioned above. The illustrated substrate 21 has first and second surfaces directed upwards and downwards of FIG. 2, respectively. As shown in FIG. 2(A), underlying X-ray transmission films 22a and 22b of silicon carbide are deposited to thicknesses of 2 micron meters on both the first and the second surfaces of the substrate 21 by the use of decompressed chemical vapor deposition, respectively, and may be called first and second transmission films. The decompressed chemical vapor deposition is carried out by using a mixed gas of dichlorosilane and acetylene as a reactive gas and a hydrogen gas as a carrier gas. The dichlorosilane, the acetylene, and the hydrogen gas are introduced into a reactive chamber at flow rates of 200 cc/minute, 30 cc/minute, and 2000 cc/minute through different conduits in a normal state, respectively. In this event, the reactive chamber is kept at a reactive gas pressure of 10 Torr and heated to a temperature of 1000° C. Under the above-mentioned conditions, it is difficult to optimize the flatness or surface roughness of the underlying X-ray transmission films 22a and 22b, although the other properties can be optimized.

Figure 2B:
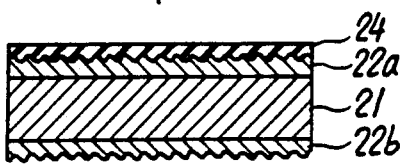

In FIG. 2(B), a dummy layer 24 may be formed by the use of the solution which is the same as that described in conjunction with the first embodiment. The dummy layer 24 is deposited on the first transmission film 22a by coating or spraying the solution by spin coating on the first transmission film 22a, by thereafter firing the sprayed solution within a nitrogen atmosphere at a temperature of 150° C. for three minutes, and by further firing the same at a temperature of 350° C. for one hour, like in FIG. 1. The illustrated dummy layer 24 has a thickness of 4500 angstroms.

Figure 2C:
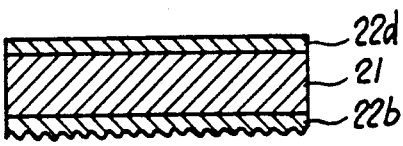

After deposition of the dummy layer 24, reactive ion etching is carried out to etch the dummy layer 24 and a part of the first transmission film 22a, as mentioned in conjunction with FIG. 1. As a result, a flat transmission film 22d remains on the substrate 21, as illustrated in FIG. 2(C). The reactive ion etching is made by the use of a mixed gas of the carbon tetrachloride gas and the oxygen gas which are caused to flow at flow rates of 26 cc/minute and 4 cc/minute in a normal state. During the etching, the gas pressure is kept at 3 Pa while the radio frequency power is set to 0.32 W/cm$^2$. Under the above-mentioned etching conditions, the first transmission film 22a and the dummy layer 24 are etched at an etching rate of 490 angstroms. The processes illustrated in FIGS. 2(B) and (C) may be called a flattening process.

Figure 2D:
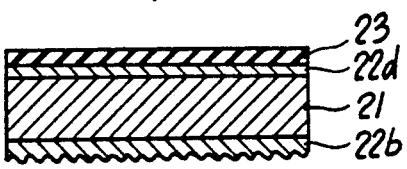

Subsequently, an overlying transmission film 23 of silicon oxide is deposited to a thickness of 1100 angstroms on the flat transmission film 22d as a part of the first transmission layer, as illustrated in FIG. 2(D). Radio frequency magnetron sputtering may be used to deposit the overlying transmission film 23 and can be carried out by using a silicon oxide target as a sputter target and an argon gas as a sputter gas. In this case, a flow rate of the argon gas is kept at 45 cc/minute in a normal state while the gas pressure and the radio frequency power are held at 0.73 Pa and 3.29 W/cm$^2$. It has been confirmed that the overlying transmission film 23 deposited on the above-mentioned conditions has a weak tensile stress of $1 \times 10^8$ dyn/cm$^2$ as the internal stress. In addition, no flattening process is required as regards the overlying transmission film 23 because the overlying transmission film 23 exhibits excellent flatness.

Figure 2E:
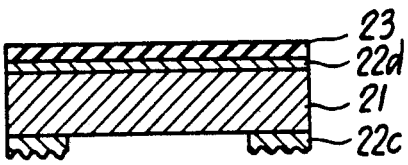

Thereafter, the second transmission film 22b of silicon carbide is etched by reactive ion etching with a circular peripheral portion 22c of the film 22b unetched, as shown in FIG. 2(E). On the reactive ion etching, a mixed gas which includes fluorine gas, such as CF$_4$ gas, and oxygen gas is used as an etching gas. The etching has been made on conditions that the flow rates of CF$_4$ gas and oxygen gas are equal to 30 cc/minute and 10 cc/minute in a normal state while the gas pressure and the radio frequency power are kept at 4 Pa and 0.49 W/cm$^2$, respectively. In this event, the second transmission film 22b is etched at an etching rate of 420 angstroms/minute.

Figure 2F:
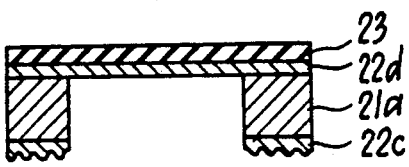

As shown in FIG. 2(F), a center portion of the silicon substrate 21 is etched by wet etching to leave a peripheral region 21a of the substrate 21. During this etching, the circular peripheral portion 22c serves as a mask. The illustrated wet etching is carried out by using a solution of 10 to 50 wt% of sodium hydroxide as an etchant, by heating the same to a temperature between 80° C. and 100° C., and by immersing the substrate illustrated in FIG. 2(E) into the solution. Consequently, a rear surface of the flat transmission film 22d is exposed, as shown in FIG. 2(F).

Figure 2G:
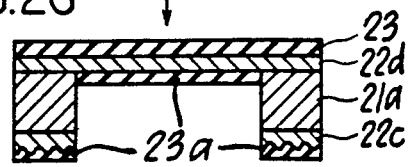

In FIG. 2(G), a silicon oxide film 23a is deposited on the circular peripheral portion 22c and the rear surface of the flat transmission film 22d to a thickness of 1100 angstroms by the use of magnetron sputtering. The silicon oxide film 23a is formed on the same conditions as the silicon oxide film 23 deposited in FIG. 2(D). Thus, an X-ray transmission layer of the multilayer structure is formed which is composed of the silicon oxide film 23a, the flat transmission film 22d of silicon carbide, and the overlying transmission film 23 of silicon oxide. In other words, the illustrated X-ray transmission layer has a sandwiched structure.

Figure 2H:
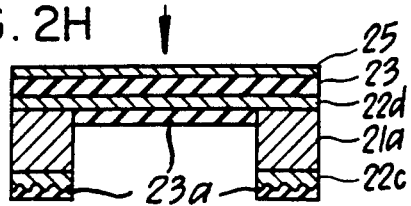

Thereafter, an X-ray absorption layer 25 of boric tantalum is deposited on an upper surface or flattened surface of the flat transmission film 23 to a thickness of 0.6 micron meter by magnetron sputtering, as shown in FIG. 2(H). Such magnetron sputtering is carried out in a manner similar to that illustrated in FIG. 1(F) and the X-ray absorption layer 25 has properties similar to the X-ray absorption layer 15 illustrated in FIG. 1(F). The internal stress is less than $1 \times 10^8$ dyn/cm$^2$.

Figure 2I:
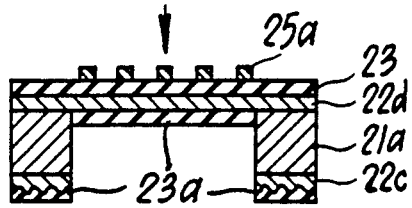

As illustrated in FIG. 2(I), the X-ray absorption layer 25 is etched by reactive ion beam etching by the use of chloride gas and a resist pattern. As a result, patterns 25a are formed on the X-ray transmission layer of the multilayer structure. Thus, the X-ray mask of the multilayer structure is manufactured.

Inasmuch as each of the silicon oxide films serves as an antireflection film in the X-ray transmission layer of the sandwiched structure mentioned above, it is possible to improve transmittivity against visible light having a wavelength of 633 nm. In fact, the illustrated X-ray mask exhibits the transmittivity of 55% against the above-mentioned light. The transmittivity of 55% is improved, as compared with the single layer of silicon carbide having the transmittivity of 40%.

The dummy layer 24 may be formed by either one of a negative type electron beam resist including silicon, a negative type photoresist including silicon, a positive type electron beam resist including silicon, a polystyrene negative type resist, a novolak resin photoresist, and the like.

In addition, the overlying transmission film 23 may be flattened in a manner similar to that illustrated in FIGS. 2(B) and (C). Alternatively, the X-ray absorption layer 25 may also be flattened like the X-ray transmission layer.

Fourth Embodiment

Figure 3A:
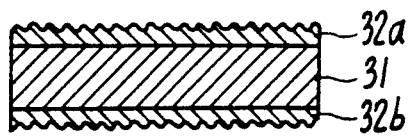
FIGS. 3(A) through (K) are sectional views for use in describing a method according to a fourth embodiment of this invention.

Referring to FIGS. 3(A) through (K), a method according to a fourth embodiment of this invention is for use in manufacturing an X-ray mask which comprises an X-ray transmission layer of a multilayer structure like in FIG. 2. However, it is to be noted that the illustrated X-ray transmission layer is composed of three films of silicon nitride-silicon oxide-silicon nitride. At first, a silicon substrate 31 is prepared which has first and second surfaces directed upwards and downwards of FIG. 3. As shown in FIG. 3(A), first and second X-ray transmission films 32a and 32b of silicon nitride are deposited on the first and the second surfaces of the substrate 31 to a thickness of 0.2 micron meter by decompressed chemical vapor deposition. Such deposition of silicon nitride is carried out under the same conditions as the second embodiment mentioned with reference to FIG. 1.

Figure 3B:
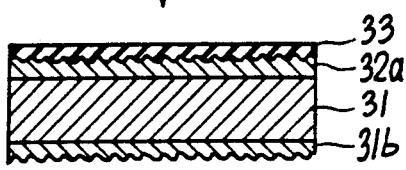

In FIG. 3(B), a dummy layer 33 is deposited on the first X-ray transmission film 32a to a thickness of about 3000 angstroms by spin coating and may be of a negative type electron beam resist including silicon.

Figure 3C:
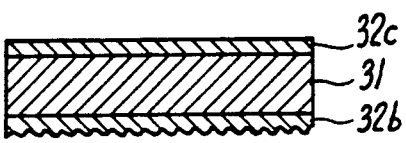

After completion of deposition, reactive ion etching is carried out to etch the dummy layer 33 and a part of the first X-ray transmission film 32a and to form a flattened transmission film 32c of silicon nitride, as illustrated in FIG. 3(C). Thus, an etch back method is used in this embodiment to flatten the first X-ray transmission film 32a. The flattened transmission film 32c will be called an underlying flattened film hereinunder. The etching conditions are similar to those illustrated in conjunction with the second embodiment.

Figure 3D:
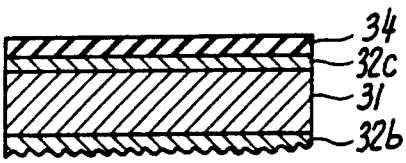

As shown in FIG. 3(D), an intermediate X-ray transmission film 34 of silicon oxide (SiOx) is deposited as a part of the X-ray transmission layer on the underlying flattened film 32c to a thickness of 1 micron meter by radio frequency magnetron sputtering. The magnetron sputtering is carried out by using an argon gas as a sputter gas and a silicon oxide target as a sputter target. The argon gas is introduced into a reactive chamber at a flow rate of 20 cc/minute in a normal state and is kept at a pressure of 0.6 Pa during the sputtering. The radio frequency power is set to 8.64 W/cm$^2$. It has been confirmed that the intermediate X-ray transmission film 34 has the tensile stress of $6 \times 10^8$ dyn/cm$^2$ as the internal stress and excellent 5 flatness. Accordingly, it is unnecessary to flatten the intermediate X-ray transmission film 34.

Figure 3E:
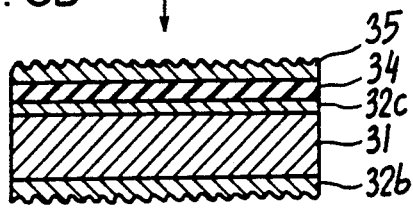

In FIG. 3(E), an overlying X-ray transmission film 35 of silicon nitride is deposited on the second partial transmission film 34 to a thickness of 0.2 micron meter by the decompressed chemical vapor deposition and serves as a part of the X-ray transmission layer. The overlying X-ray transmission film 35 of silicon oxide may be formed under the same conditions as the first X-ray transmission film 32a illustrated in FIG. 3(A). In the example being illustrated, the overlying X-ray transmission film 35 is flattened like in FIGS. 3(B) and (C).

Figure 3F:
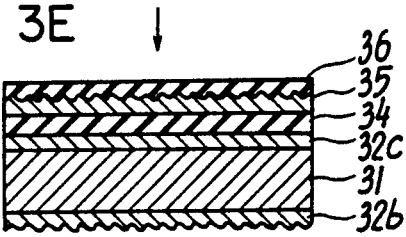
Figure 3G:
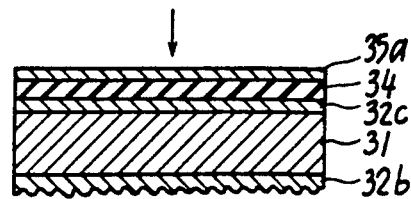

As illustrated in FIG. 3(F), a dummy layer 36 is coated on the overlying X-ray transmission film 35 by spin coating like in FIG. 3(B) and may be formed by the negative type electron beam resist including silicon. Subsequently, the dummy layer 36 and a part of the overlying X-ray transmission film 35 are etched by the reactive ion etching in the manner mentioned in conjunction with FIG. 3(B). As a result, the overlying X-ray transmission film 35 is partially etched and flattened to form a flattened transmission film 35a which may be referred to as a third partial transmission film. Thus, the X-ray transmission layer is deposited which is composed of the first partial transmission film 32c of silicon nitride, the second partial transmission film 34 of silicon oxide, and the third partial transmission film 35a of silicon nitride.

Figure 3H:
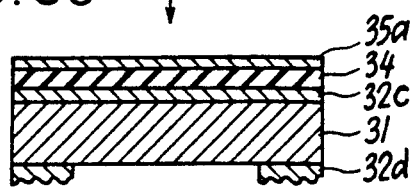
Figure 3I:
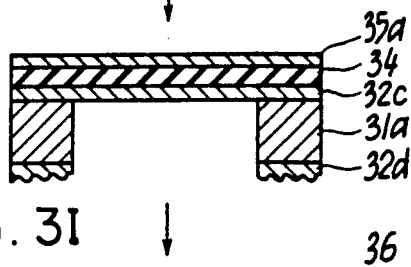

After deposition of the X-ray transmission layer, the second X-ray transmission film 32b of silicon nitride is partially etched by the reactive ion etching similar to that illustrated in FIG. 3(C) and is partially removed from the second surface of the substrate 31, as illustrated in FIG. 3(H). Specifically, a center portion of the second X-ray transmission film 32b is removed to expose a center region of the substrate 31 with a circular peripheral portion 32d left on the second surface of the substrate 31. The reactive ion etching is carried out by the use of an etching gas which includes fluorine gas, such as CF4 gas. The etching conditions for the silicon nitride have been described in conjunction with the second embodiment and will not be described any longer.

Subsequently, the exposed center region of the substrate 31 is etched out by using the circular peripheral portion 32d of the second X-ray transmission film 32b by wet etching, like in FIG. 2(F). The wet etching is made under the same conditions as that illustrated in conjunction with FIG. 2(F).

Figure 3J:
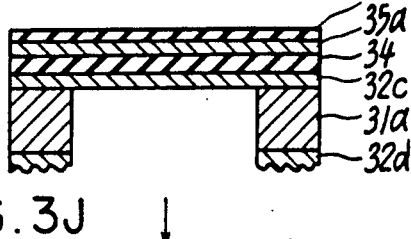

In FIG. 3(J), an X-ray absorption layer 36 of boric tantalum is deposited on the third partial transmission film 35a to a thickness of 0.6 micron meter by the use of the radio frequency magnetron sputtering. The sputtering conditions have been mentioned with reference to the X-ray absorption layer 15 (FIG. 1(F)) and will not therefore be described any longer. At any rate, the X-ray absorption layer 36 has an amorphous structure, a weak tensile stress of $1 \times 10^8$ dyn/cm$^2$ as the internal stress, and excellent flatness or roughness smaller than 100 angstroms.

Figure 3K:
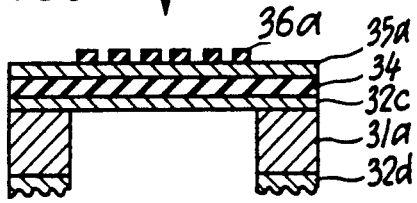

Thereafter, reactive ion beam etching is carried out by the use of chloride gas by using a resist pattern as a mask to etch the X-ray absorption layer 36 to form patterns 36a, as shown in FIG. 3(K). Thus, the X-ray mask is manufactured which comprises the first through third partial transmission films.

While this invention has thus far been described in conjunction with a few embodiments thereof, it will readily be possible for those skilled in the art to put this invention into practice in various other manners. For example, a material of the X-ray transmission layer is not restricted to either the silicon carbide or the silicon nitride but may be boron nitride, silicon, or the like. As a sandwiched structure, various kinds of combinations can be used to form the X-ray transmission layer. The X-ray absorption layer may be formed by a selected one of gold (Au), tantalum (Ta), tungsten (W), rhenium (Re), an alloy of the exemplified metal and nonmetal, such as tantalum nitride (TaNx), tungsten nitride (WNx), tantalum oxide (TaOX), tungsten oxide (WOx), or the like.

What is claimed is:

1. A method of manufacturing an X-ray mask which is for use in an X-ray lithography and which comprises a substrate having a principal surface, an X-ray transmission layer on said principal surface, and an X-ray absorption layer on said X-ray transmission layer, said method comprising the steps of:

determining conditions of depositing said X-ray transmission layer on said principal surface under said conditions, said X-ray transmission layer having undulation;

flattening the undulation of said X-ray transmission layer; and depositing said X-ray absorption layer.

2. A method as claimed in claim 1, wherein said X-ray transmission layer is formed by silicon carbide (SiCx).

3. A method as claimed in claim 1, wherein said X-ray transmission layer is formed by silicon nitride.

4. A method as claimed in claim 1, wherein said flattening step comprises the steps of:

coating a dummy layer on said X-ray transmission layer; and etching said dummy layer and a part of said X-ray transmission layer to remove said undulation and to flatten said X-ray transmission layer.

5. A method as claimed in claim 4, wherein said X-ray transmission layer is etched at an etching rate substantially equal to said dummy layer.

6. A method as claimed in claim 1, wherein said X-ray transmission layer depositing step comprises the steps of:

depositing a first X-ray transmission film of silicon carbide on said principal surface, said first X-ray transmission film having the undulation;

removing said undulation of the first X-ray transmission film to form a flattened transmission film;

depositing a second X-ray transmission film of silicon oxide on said flattened transmission film.

7. A method as claimed in claim 6, said substrate having a back surface opposite to said principal surface, wherein said X-ray transmission layer depositing step further comprises the steps of:

depositing a back X-ray transmission film of silicon carbide simultaneously with said first X-ray transmission film;

selectively etching said back X-ray transmission film to expose a part of said back surface of the substrate;

etching said part of the substrate from said back surface of the substrate to said first X-ray transmission film;

depositing an underlying transmission film of silicon oxide on said first X-ray transmission film so as to interpose said first X-ray transmission film by said second X-ray transmission film and said underlying transmission film.

8. A method as claimed in claim 1, said substrate having a back surface opposite to said principal surface, wherein said X-ray transmission layer depositing step comprises the steps of:

depositing first and second X-ray transmission films of silicon nitride on said principal and said back surfaces of the substrate;

forming a dummy layer on said first X-ray transmission film; and etching said dummy layer and a part of said first X-ray transmission film to flatten the first X-ray transmission film and to form a flattened transmission film.

9. A method as claimed in claim 8, wherein said X-ray transmission layer depositing step further comprises the steps of:

depositing an intermediate X-ray transmission film of silicon oxide on said flattened transmission film;

depositing an overlying X-ray transmission film of silicon nitride on said intermediate X-ray transmission film;

coating an additional dummy layer on said overlying X-ray transmission film; and etching said additional dummy layer and a part of said overlying X-ray transmission film to flatten said overlying X-ray transmission film and to form an additional flattened transmission film.

10. An X-ray mask comprising a substrate having a principal surface, an X-ray transmission layer on said principal surface, and an X-ray absorption layer on said X-ray transmission layer, said X-ray transmission layer being subjected to a flattened process and having roughness smaller than 100 angstroms.

11. An X-ray mask as claimed in claim 10, wherein said X-ray transmission layer further has a tensile stress between $1 \times 10^8$ and $8 \times 10^8$ dyn/cm$^2$.

* * * * *

Notice of Adverse Decisions in Interference

In Interference No., 102,693, involving Patent No. 5,005,075, M. Kobayashi, Y. Yamaguchi, M. Sugawara, K. Yamashiro, X-RAY MASK AND METHOD OF MANUFACTURING AN X-RAY MASK, final judgment adverse to the patentees was rendered June 16, 1992, as to claims 1-5, 10 and 11.

*(Official Gazette August 25, 1992.)*